United States Patent [19]

Hara et al.

[11] Patent Number: 4,733,110

[45] Date of Patent: Mar. 22, 1988

[54] BICMOS LOGICAL CIRCUITS

[75] Inventors: Hiroyuki Hara, Tokyo; Yasuhiro Sugimoto, Yokohama, both of Japan

[73] Assignee: Kabushiki Kaisha Toshiba, Kawasaki, Japan

[21] Appl. No.: 29,194

[22] Filed: Mar. 23, 1987

[30] Foreign Application Priority Data

Mar. 22, 1986 [JP] Japan .................................. 61-62009

[51] Int. Cl.[4] .......................................... H03K 19/01
[52] U.S. Cl. .................................... 307/446; 307/443; 307/451; 307/454; 307/570
[58] Field of Search ............... 307/443, 446, 448, 451, 307/454, 475, 570

[56] References Cited

U.S. PATENT DOCUMENTS

| 4,253,033 | 2/1981 | Redfern | 307/446 |
| 4,301,383 | 11/1981 | Taylor | 307/475 X |
| 4,678,940 | 7/1987 | Vasseghi et al. | 307/443 X |
| 4,678,943 | 7/1987 | Uragami et al. | 307/443 X |
| 4,689,503 | 8/1987 | Suzuki et al. | 307/446 |

OTHER PUBLICATIONS

Cin et al, "Complementary MOS-Bipolar Transistor Structure", *IEEE Teld*, vol. ED-16, No. 11, 11–19 69, pp. 945–951.

"Complementary FET-Bipolar Circuit", *IBM T.D.B.*, vol. 29, No. 4, Sep. 1986, pp. 1857–1858.

*Primary Examiner*—Stanley D. Miller
*Assistant Examiner*—D. R. Hudspeth
*Attorney, Agent, or Firm*—Schwartz, Jeffery, Schwaab, Mack, Blumenthal & Evans

[57] ABSTRACT

Logical NAND circuits, each consisting of a logical operational portion, an output control portion comprising the combination of a bipolar transistor and a plurality of NMOS transistors, and an output portion comprising first and second bipolar transistors connected in series between power supply voltage and the ground in which the merits of the MOS transistors and the bipolar transistors can be demonstrated by the particular combination of the two different kinds of the transistors in the logical circuit, thereby increasing the current driving performance while reducing power consumption without making the size of the logical circuit large.

8 Claims, 6 Drawing Figures

BICMOS LOGICAL CIRCUITS

BACKGROUND OF THE INVENTION

1. Field of the Invention

The present invention relates to improved logical circuits having a high speed, current driving capability by the use of CMOS transistors and bipolar transistors.

2. Description of the Prior Art

Conventionally, there were some problems in the logical circuits, such as NAND circuits. FIG. 1 shows a logical circuit consisting of CMOS transistors i.e., two-input NAND circuit, which is comprised of a NAND operational portion 1 and two inverter circuits 3 and 5 connected in series.

The NAND operational portion 1 consists of a pair of P-channel MOS transistor (which is referred to as PMOS transistor hereafter respectively) 7 and N-channel MOS transistors (which is referred to hereafter as NMOS transistor, respectively) 9 and 11, and PMOS transistor 13 and NMOS transistors 15 and 17 which are connected between power supply $V_{DD}$ and ground and which perform the NAND logical operation of the input signals applied to the input terminals A and B.

The inverter circuit 5 constitutes an output stage of the NAND operational portion 1 and it produces the result of the operation performed in the NAND operational portion 1 from the output terminal C after amplifying it.

When the NAND circuit is constructed only by the CMOS transistors in the manner as described above, it follows that the merits of the CMOS transistors are demonstrated, resulting in the reduction of power consumption. On the other hand, however, since the transfer conductance of the MOS transistor is small, compared with that of the bipolar transistor, the current driving capability or performance becomes small, with the result that a high speed operation is difficult to perform when the load capacity is increased.

In order to overcome the drawback described above, the current driving performance is increased by making the size of the MOS transistors in the output stage large in accordance with the conditions of the load capacity, so as to perform the high speed operation in the NAND circuit according to the prior art. However, here again, this kind of the approach according to the prior art results in a large size of the circuit and this becomes an obstacle, particular in view of realization of less miniaturization in the integrated circuits.

Furthermore, when the NAND circuit is constructed only by the bipolar transistors, the current driving performance can be increased, to be sure. However, a current tends to flow through the circuit even in the steady state, thus increasing the power consumption.

As has been described above, although the power consumption may be reduced in a sense by constructing the logical circuit by the use of only the CMOS transistors, it becomes difficult to obtain a large current driving performance from the miniaturized circuits.

On the other hand, when the logical circuit is constructed only by the bipolar transistors, it results in the increase in the power consumption, i.e., antinomy occurs in this case. As a result, it becomes not possible to increase the current driving performance without making the size of the circuit construction large, while reducing the power consumption.

SUMMARY OF THE INVENTION

It is therefore an object of the present invention to provide a logical circuit capable of increasing the current driving performance without increasing the size of the circuit construction, as well as reducing power consumption.

It is another object of the present invention to provide a logical circuit capable of performing a high speed operation even if the capacity of a load is increased, with reduced power consumption.

One feature of the present invention resides in a logical circuit which comprises: a logical operational portion consisting of first and second type MOS transistors for performing a logical operation of input signals; an output control portion having an inverter for inverting an output signal from the operational portion and the remaining circuit portion comprising a first bipolar transistor connected between power supply and the ground and conductively controlled by the output signal from the inverter circuit, a first-type first MOS transistor conductively controlled by the output signal from the logical operational portion, a first-type second MOS transistor connected between an output terminal and the ground and conductively controlled by the emitter potential of the bipolar transistor, a first-type third MOS transistor conductively controlled by the output signal from the inverter circuit and a first-type fourth MOS transistor conductively controlled by the output signal from the logical operational portion, the first-type third and fourth MOS transistors being connected in series between the output terminal and the ground; and an output portion consisting of a second bipolar transistor conductively controlled by the output signal from the logical operational portion and a third bipolar transistor conductively controlled by the output signal from the source potential of the first-type third MOS transistor, the second and third bipolar transistors being connected in series between the power supply and the ground, for producing the result of the logical operation of the input signals, with the junction of the series connected bipolar transistors being the output terminal of the logical circuit.

Another feature of the present invention resides in a logical circuit which comprises: a logical operational portion consisting of first and second type MOS transistors for performing a logical operation of input signals; an output control portion having an inverter circuit portion for inverting an output signal from the operational portion and the remaining circuit portion comprising a first bipolar transistor connected between power supply and the ground and conductively controlled by the output signal from the logical operational portion, a first-type first MOS transistor conductively controlled by the output signal from the logical operational portion, a first-type second MOS transistor connected between the power supply and the ground and conductively controlled by the emitter potential of the first bipolar transistor, a first-type third MOS transistor conductively controlled by the output signal from the inverter circuit and a first-type fourth MOS transistor conductively controlled by the output signal from the operational portion, first-type third and fourth MOS transistors being connected in series between the output terminal and the ground; an output portion consisting of a second bipolar transistor conductively controlled by the output signal from the inverter circuit and a third bipolar transistor conductively controlled by the source potential of the first-type fourth MOS transistor, the second and third bipolar transistors being connected in series between the power supply and the ground, for producing the result of the logical operation of the input signals, with the junction of the series connected bipolar transistors being the output terminal of the logical circuit.

These and other objects, features and advantages of the invention will be better understood from the detailed description of the invention with reference to the accompanying drawings.

DESCRIPTION OF THE PREFERRED EMBODIMENT

Figure 1:
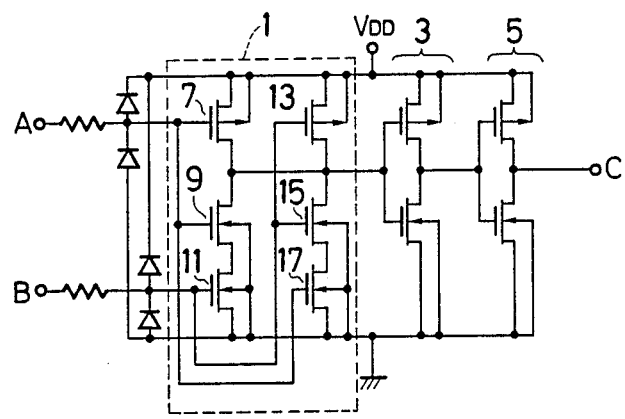
FIG. 1 shows a two-input logical NAND circuit according to the prior art.
Figure 2:
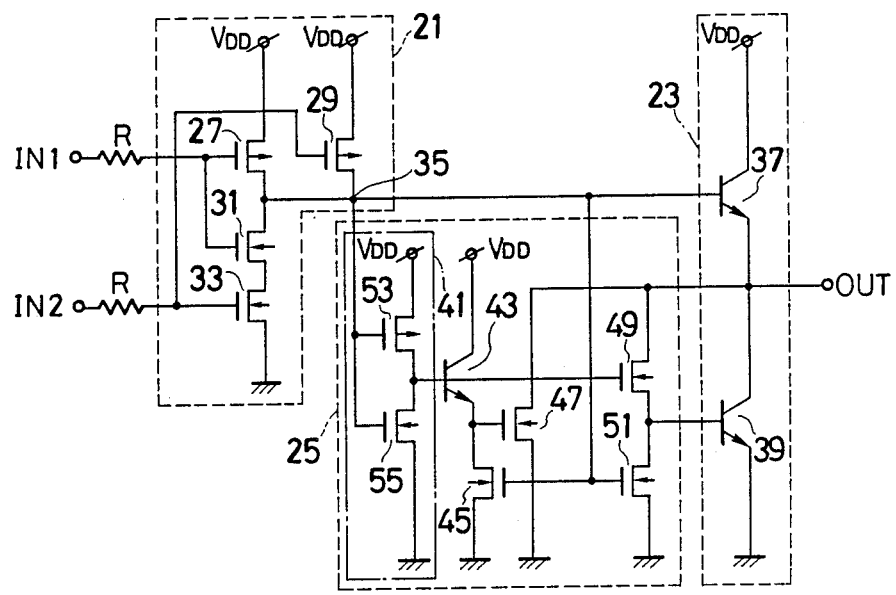
FIG. 2 shows one embodiment of the logical NAND circuit according to the present invention.

FIG. 2 shows one embodiment of the logical NAND circuit according to the present invention which comprises a NAND operational portion 21, an output portion 23, and an output control portion 25.

The NAND operational portion 21 is comprises of the PMOS transistors 27 and 29 and the NMOS transistors 31 and 33. The PMOS transistors 27 and 29 have its gate terminal or electrode connected to each of the input terminals IN 1 and IN 2 through each of resistors R, R for input protection, its source electrode connected to the power supply $V_{DD}$ and its drain electrode connected to each other, respectively.

The NMOS transistors have its gate electrode connected to each of the input terminals IN 2 through each of the resistors R, R for the input protection, and each of the NMOS transistors is connected in series to each other, between the drain electrode of the PMOS transistor 27 and the ground. The NAND operational portion 21 performs logical NAND operation of the input signals applied to the input terminals IN 1 and IN 2 and produces the result of the operation at the output terminal 35.

The output portion 23 comprises two NPN-type bipolar transistors 27 and 39 (which is referred to as Bi-NPN transistor hereafter, respectively) connected to in a totem pole manner. The Bi-NPN transistor 37 has its base electrode connected to the output terminal 35 of the NAND operational circuit, its collector electrode connected to the power supply $V_{DD}$, and its emitter connected to the output terminal OUT to be connected to a load, not shown here, respectively. The Bi-NPN transistor 39 has its collector connected to the output terminal OUT and its emitter connected to the ground, respectively.

The output control portion 25 comprises an inverter circuit 41, a Bi-NPN transistor 43 and four NMOS transistors 45, 47, 49, and 51. The inverter circuit 41 is connected in series between the power supply $V_{DD}$ and the ground and it comprises the PMOS transistor 53 and the NMOS transistor 55 which have its gate electrode connected to the output terminal 35, respectively. The Bi-NPN transistor 43 has its base terminal connected to the drain electrode of the PMOS transistor 53 and its collector terminal connected to the power supply $V_{DD}$. The NMOS transistor 45 has its gate terminal connected to the output terminal 35, its drain electrode connected to the emitter electrode of the Bi-NPN transistor 43 and its source electrode connected to the ground. The NMOS transistor 47 has its gate electrode connected to the emitter of the Bi-NPN transistor 43, its drain electrode connected to the output terminal OUT, and its source electrode connected to the ground, respectively.

The NMOS transistor 47 is provided so as to permit the output terminal OUT to be the ground potential in a low level condition of the output terminal OUT by flowing a current from the output terminal OUT to the ground. The NMOS transistor 47 is not necessarily required to be large and it depends upon its application. In other words, the size of the NMOS transistor 47 is normally made large in order to increase the current IoL, but it is basically for permitting the output signal to be the ground level as its function.

The NMOS transistor 49 has its gate electrode connected to the base terminal of the Bi-NPN transistor 43, its drain electrode connected to the output terminal OUT, and its source electrode connected to the base terminal of the Bi-NPN transistor 39. The NMOS transistor 51 has its gate electrode connected to the output terminal 35, its drain electrode connected to the base terminal of the Bi-NPN transistor 39 and its source electrode connected to the ground. The output control portion 25 thus constructed functions to control the ON and OFF conditions of Bi-NPN transistor 39 and the NMOS transistor 47 in accordance with the signal applied from the output terminal 35.

The operation of the NAND circuit according to the present invention is as follows;

When input signals having a high level respectively are applied to the input terminals IN 1 and IN 2, the PMOS transistors 27 and 29 are rendered non-conductive while the NMOS transistors 31 and 33 are rendered conductive. As a result, the output terminal 35 becomes a low level condition and this in turn renders the Bi-NPN transistor 37 non-conductive, as well as rendering the NMOS transistors 45 and 51 non-conductive. In addition, the PMOS transistor 53 constituting the inverter circuit 41 is rendered conductive while the NMOS transistor 55 is rendered non-conductive. Consequently, the base terminal of the Bi-NPN transistor 43 becomes a high level condition and the Bi-NPN transistors 43 and 47 as well as the Bi-NPN transistor 47 are rendered conductive. In this case, the gate electrode of the NMOS transistor 49 becomes high level condition and it is rendered conductive. As a result, a current flows from a load to be connected to the output terminal OUT to the base terminal of the Bi-NPN transistor 39, thus rendering it conductive.

Consequently, a current flows from the load to the ground through the Bi-NPN transistor 39 and NMOS transistor 47 and the potential at the output terminal OUT is lowered to the ground potential, with the result that the potential at the output terminal OUT becomes low level condition. This means that when high level input signals are applied to the input terminals IN 1 and IN 2, a low level output signal is produced from the output terminal OUT.

On the other hand, when a low level input signal is applied to either the input terminal IN 1 or IN 2, either one of the PMOS transistors 27 and 29 is rendered conductive, and either one of the NMOS transistors 31 and 33 is rendered non-conductive, so that the output terminal 35 becomes high level condition. As a result, the PMOS transistor 53 is rendered non-conductive while the NMOS transistor 55 is rendered conductive, thus rendering the Bi-NPN transistor 43 and NMOS transistor 49 non-conductive.

On the other hand, since the output terminal 35 becomes high level condition, the Bi-NPN 37 is rendered conductive. This in turn renders the NMOS transistors 45 and 51 conductive and the gate electrode of the NMOS transistor 47 as well as the gate electrode of the Bi-NPN transistor 39 becomes low level condition respectively, while the NMOS transistor 47 and Bi-NPN transistor 39 are rendered non-conductive. As a result, a current flows from the power supply $V_{DD}$ to the load to be connected to the output terminal OUT, so that the potential at the output terminal OUT is increased up to near the power supply voltage and the potential at the output terminal OUT becomes high level condition. In short, when a low level input signal is applied to either one of the input terminals IN 1 and IN 2, a high level output signal is produced at the output terminal OUT. Accordingly, the NAND operation can be performed in this circuit.

Figure 3:
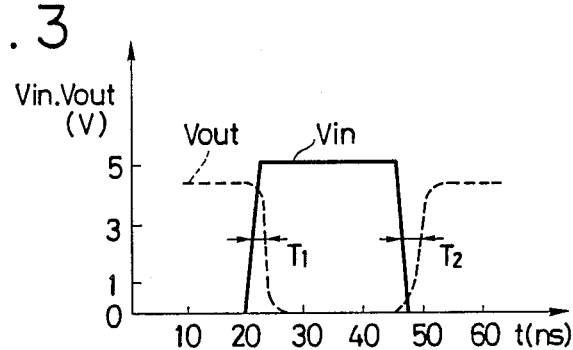
FIG. 3 is the characteristic of response between the input signal and the output signal of the NAND circuit of FIG. 2.

FIG. 3 shows the result of simulation of response between the input signal and the output signal obtained from the NAND circuit shown in FIG. 2. In FIG. 3, the time $T_1$ during which the input signal is increased to $\frac{1}{2}$ potential of the input amplitude and the output signal is decreased to $\frac{1}{2}$ potential of the output amplitude is 3.0 nsec and the time $T_2$ during which the input signal is decreased to $\frac{1}{2}$ potential of the input amplitude and the output signal is increased to $\frac{1}{2}$ potential of the output amplitude is 3.5 nsec. This means that a high speed NAND operations can be performed.

Figure 4:
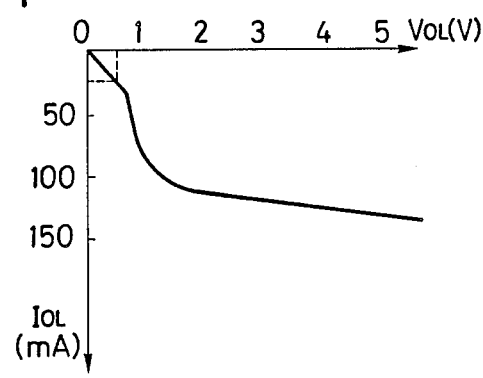
FIG. 4 is the characteristic of a low level output voltage VoL and a low level output current IoL of the circuit of FIG. 2.
Figure 5:
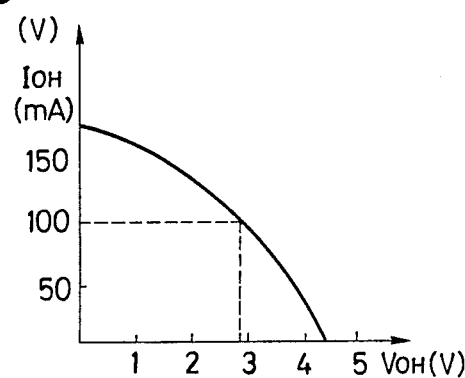
FIG. 5 is the characteristic of a high level output voltage VoH and a high level output current IoH of the circuit of FIG. 2.

FIGS. 4 and 5 show respectively the current driving performance of the NAND circuit of FIG. 2. Namely, FIG. 4 shows the characteristic of the voltage VoL vs. the current IoL. It will be appreciated from the characteristic that the current IoL becomes 25 mA when the voltage VoL=0.5 V. FIG. 5 shows the characteristic of high level voltage VoH vs. high level current IoH. It will be appreciated from this characteristic that the current IoH becomes 100 mA when the voltage VoH is 2.8 V. This shows that a sufficient value can be obtained both in the voltage and current of IoL and VoL, thus realizing the high current driving performance. Moreover, since no current flows through the circuit thus constructed according to the present invention in the steady state condition, power consumption can be reduced, as well.

Figure 6:
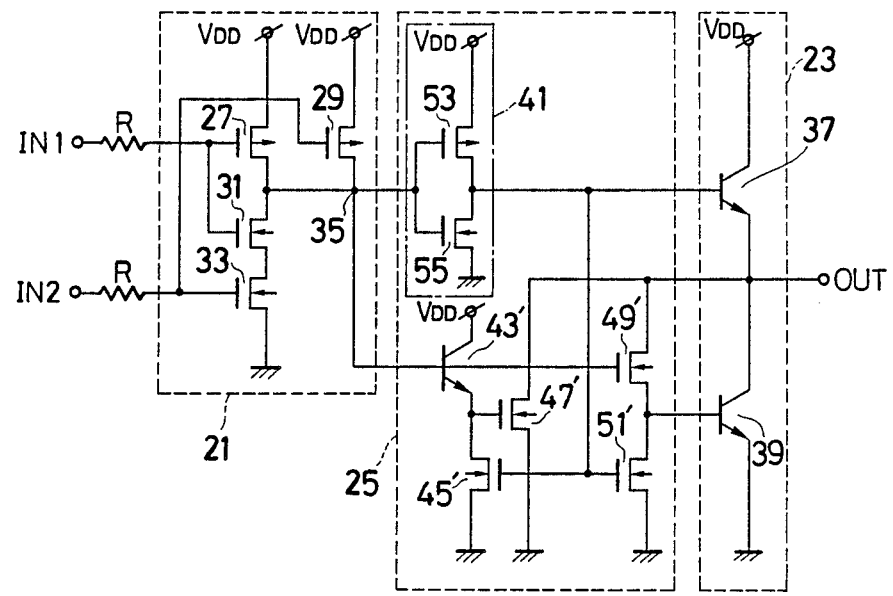
FIG. 6 shows another embodiment of the NAND circuit according to the present invention.

FIG. 6 shows another embodiment of the NAND circuit according to the present invention. In this embodiment, the inverter circuit 41 consisting of CMOS transistors is connected to between the output terminal 35 of the NAND operational portion 21 and the base terminal of the Bi-NpN transistor 37 which constitutes the output portion 23 while the output terminal 35 is directly connected to the base terminal of the Bi-NPN transistor 13, so as to perform AND operation. With this construction, the same NAND function as that of FIG. 2 can be realized as a whole by this circuit.

In this second embodiment, same reference numerals are attached to the same constructing elements as those of the first embodiment shown in FIG. 2.

As described in the foregoing embodiments according to the present invention, since the logical NAND operation of the input signals is performed in the NAND circuit constructed in such a manner that the output stage is constructed by bipolar transistors, and conductive and non-conductive conditions of the bipolar transistors are controlled in accordance with the result of the operation in the logical operational portion which consists of CMOS transistors, a high current driving performance can be obtained without making the circuit construction large, yet with reduced power consumption.

While the invention has been described in its preferred embodiments, it is to be understood that the words which have been used are words of description rather than limitation and that various changes and modifications may be made within the purview of the appended claims without departing from the true scope and spirit of the invention in its broader aspects.

What is claimed is:

1. A logical circuit which comprises:
    a logical operational portion (21) consisting of first and second type MOS transistors for performing a logical operation of input signals;
    an output control portion (25) having an inverter circuit (41) for inverting an output signal from said operational portion and the remaining circuit portion comprising a first bipolar transistor (43) connected between power supply ($V_{DD}$) and the ground and conductively controlled by the output signal from said inverter circuit, a first-type first MOS transistor (55) conductively controlled by the output signal from said logical operational portion, a first-type second MOS transistor (47) connected between an output terminal and the ground and conductively controlled by the emitter potential of said bipolar transistor, a first-type third MOS transistor (49) conductively controlled by the output signal from said inverter circuit and a first-type fourth MOS transistor (51) conductively controlled by the output signal from said logical operational portion, said first-type third and fourth MOS transistors being connected in series between the output terminal and the ground; and
    an output portion (23) consisting of a second bipolar transistor (37) conductively controlled by the output signal from said logical operational portion and a third bipolar transistor (39) conductively controlled by the output signal from the source potential of the first-type third MOS transistor, said second and third bipolar transistors being connected in series between the power supply and the ground for producing the result of the logical operation of the input signals with the junction of the series connected bipolar transistors being the output terminal (OUT) of the logical circuit.

2. The logical circuit as claimed in claim 1 wherein the logical circuit is a NAND circuit.

3. The logical circuit as claimed in claim 1 wherein the first and second-type MOS transistors in the logical operational portion are PMOS and NMOS transistors, each gate electrode of which being connected to each of the input terminals and each of the source electrodes of the PMOS transistors is connected to the power supply, while each of the source electrodes of the NMOS transistors is connected in series to each other and each drain of the PMOS transistors is connected as a common output terminal of the logical operational portion.

4. The logical circuit as claimed in claim 1 wherein said first-type first, second third, and fourth MOS transistors are NMOS transistors, respectively.

5. A logical circuit which comprises:

a logical operation portion (21) consisting of first and second-type MOS transistors for performing a logical operation of input signals;

an output control portion (25) having an inverter circuit portion (41) for inverting an output signal from said operational portion and the remaining circuit portion comprising a first bipolar transistor (43') connected between power supply ($V_{DD}$) and the ground and conductively controlled by the output signal from said logical operation portion, a first-type first MOS transistor (45') conductively controlled by the output signal from said inverter circuit, a first-type second MOS transistor (47') connected between an output terminal and the ground and conductively controlled by the emitter potential of said first bipolar transistor, a first-type third MOS transistor (51') conductively controlled by the output signal from said inverter circuit and a first-type fourth MOS transistor (49') conductively controlled by the output signal from said logical operational portion, said first-type third and fourth MOS transistors being connected in series between the output terminal and the ground; and an output portion (23) consisting of a second bipolar transistor (37) conductively controlled by the output signal from said inverter circuit and a third bipolar transistor (39) conductively controlled by the source potential of said first-type fourth MOS transistor, said second and third bipolar transistors being connected in series between the power supply and the ground, for producing the result of the logical operation of the input signals, with the junction of the series connected bipolar transistors being the output terminal (OUT) of the logical circuit.

6. The logical circuit as claimed in claim 5 wherein said logical circuit is a NAND circuit.

7. The logical circuit as claimed in claim 5 wherein the first and second type MOS transistors in the logical operation portion are PMOS and NMOS transistors, each gate electrode of which being connected to each of the input terminals and each of the source electrodes of the PMOS transistors is connected to the power supply, while each of the source electrodes of the NMOS transistors is connected in series to each other and each drain of the PMOS transistors is connected as a common output terminal of the logical operational portion.

8. The logical circuit as claimed in claim 5 wherein said first-type first, second, third, and fourth MOS tranistors are NMOS transistors, respectively.

* * * * *